United States Patent
Yao et al.

(10) Patent No.: US 8,068,337 B2
(45) Date of Patent: Nov. 29, 2011

(54) PORTABLE APPARATUS AND POSITIONING DEVICE THEREOF

(75) Inventors: Guo-Ping Yao, Shenzhen (CN); Shi-Kun Guo, Shenzhen (CN); Xue-Dong Tang, Shenzhen (CN); Ke-Hui Peng, Shenzhen (CN); Qia-Kai Xie, Shenzhen (CN); Jin-Feng Liu, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 231 days.

(21) Appl. No.: 12/494,306

(22) Filed: Jun. 30, 2009

(65) Prior Publication Data

US 2010/0008027 A1    Jan. 14, 2010

(51) Int. Cl.
*G06F 1/16* (2006.01)

(52) U.S. Cl. ......... 361/679.43; 361/679.41; 361/679.58; 248/346.03; 248/560; 248/678; 710/303; 710/304

(58) Field of Classification Search ............. 361/679.43, 361/679.58
See application file for complete search history.

(56) References Cited

U.S. PATENT DOCUMENTS

| | | | | |
|---|---|---|---|---|
| 1,778,992 A * | 10/1930 | Wulfert | | 248/635 |
| 3,895,408 A * | 7/1975 | Leingang | | 16/2.1 |
| 4,969,830 A * | 11/1990 | Daly et al. | | 439/136 |
| 5,030,128 A * | 7/1991 | Herron et al. | | 439/372 |
| 5,706,168 A * | 1/1998 | Erler et al. | | 361/679.34 |
| 5,859,628 A * | 1/1999 | Ross et al. | | 345/173 |
| 5,926,627 A * | 7/1999 | Sugimura | | 710/303 |
| 6,000,665 A * | 12/1999 | Clementson et al. | | 248/118 |
| 6,229,698 B1* | 5/2001 | Harvey | | 361/679.55 |
| 6,954,940 B2* | 10/2005 | Hsu | | 720/639 |
| 7,016,189 B2* | 3/2006 | Lin | | 361/679.34 |
| 7,070,157 B2* | 7/2006 | Huprikar et al. | | 248/636 |
| 7,085,132 B2* | 8/2006 | Schlesener et al. | | 361/679.23 |
| 7,173,818 B2* | 2/2007 | Hou et al. | | 361/679.56 |
| 7,256,990 B2* | 8/2007 | Grunow et al. | | 361/679.41 |
| 7,306,386 B2* | 12/2007 | Lyman et al. | | 400/88 |
| 7,510,163 B2* | 3/2009 | Schlitzkus et al. | | 248/635 |
| 7,839,639 B2* | 11/2010 | Najbert | | 361/695 |
| 7,911,778 B2* | 3/2011 | Merrow | | 361/679.37 |
| 2002/0043608 A1* | 4/2002 | Nakata et al. | | 248/560 |
| 2003/0160138 A1* | 8/2003 | Rawlings et al. | | 248/176.3 |
| 2005/0024691 A1* | 2/2005 | Qian et al. | | 358/474 |
| 2005/0237709 A1* | 10/2005 | Huang | | 361/685 |
| 2008/0083865 A1* | 4/2008 | Matsui | | 248/496 |
| 2009/0063745 A1* | 3/2009 | Morris et al. | | 710/304 |
| 2009/0198853 A1* | 8/2009 | Escamilla et al. | | 710/302 |

* cited by examiner

*Primary Examiner* — Jinhee Lee
*Assistant Examiner* — Anthony Q Edwards
(74) *Attorney, Agent, or Firm* — Altis Law Group, Inc.

(57) ABSTRACT

A portable apparatus includes an electronic device defining a locking slot and a positioning device for detachably attached to the electronic device. The positioning device includes a cover defining an opening and a through hole; a supporting member comprising a hook protruding from the through hole to insert in the locking slot to lock in the electronic device and a supporting portion protruding from the opening of the cover to support the electronic device; and a dampening member fixed to the supporting member in the cover.

15 Claims, 4 Drawing Sheets

PORTABLE APPARATUS AND POSITIONING DEVICE THEREOF

BACKGROUND

1. Technical Field

The present disclosure relates to portable apparatuses, and more particularly to a position device for fastening an electronic device to an object.

2. Description of Related Art

Portable electronic devices such as handheld flat screen televisions and portable disc players are widely used because of their small sizes. Users may carry their portable electronic devices when travelling for business or entertainment. However, the users may have to hold the portable electronic devices in their hands or rest on their thighs or on a flat surface of the vehicle they are travelling on. After a period of time, the users' hands or thighs may become tired or the electronic devices may fall off the table when the vehicle turns or due to bumps in the road.

Therefore, a need exits for providing a positioning device that the electronic device can be positioned thereof.

DETAILED DESCRIPTION

Figure 1:
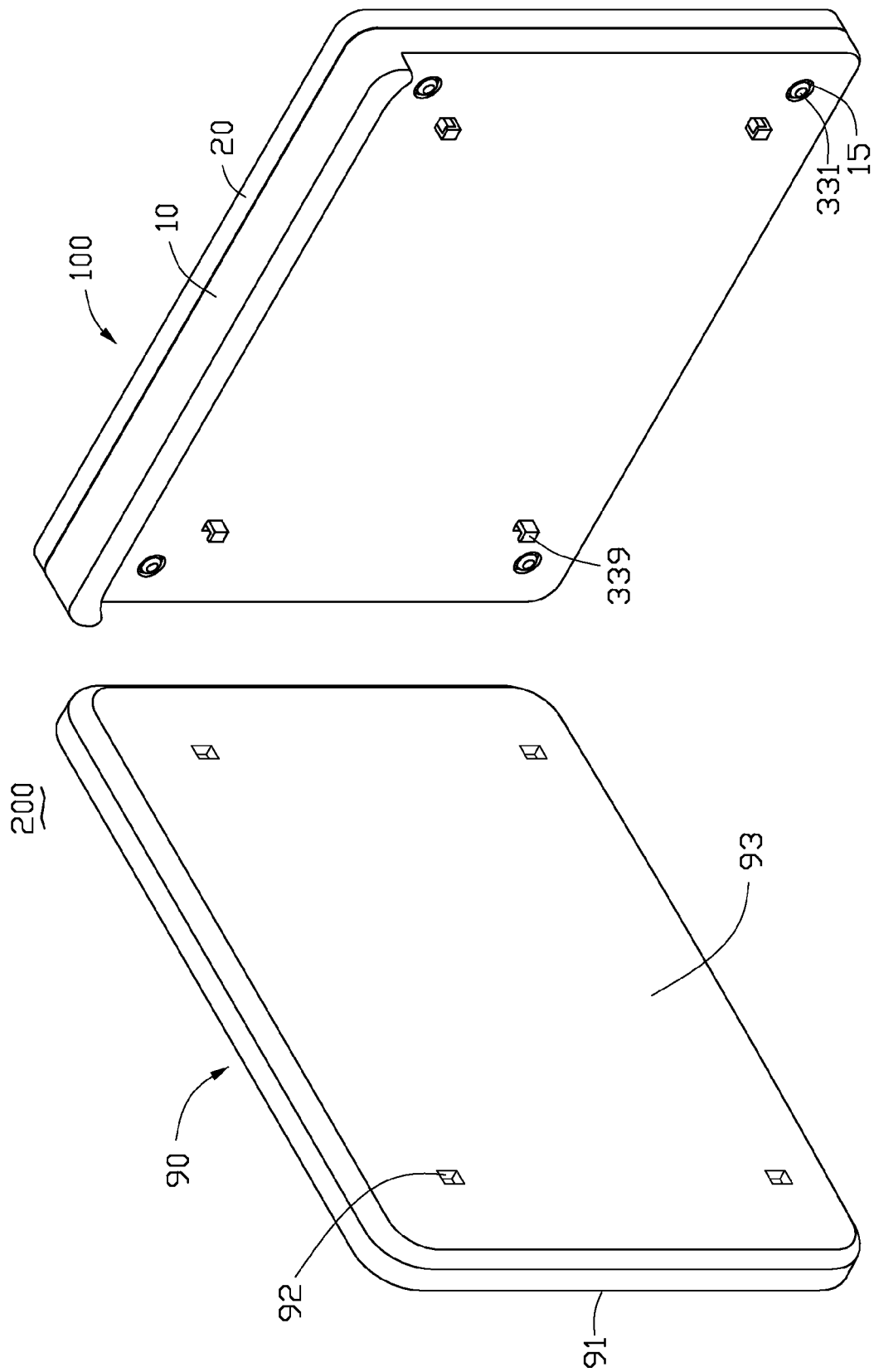
FIG. 1 is an isometric view of a portable apparatus, comprising a positioning device and an electronic device, in accordance with an exemplary embodiment.

Referring to FIG. 1, a portable apparatus 200 includes an electronic device 90 and a positioning device 100 detachably attached to the electronic device 90 for positioning the electronic device 90 to another object (not shown), such as the back of a seat of a vehicle. The electronic device 90 may be a disc player, a handheld flat screen television, and so on.

The electronic device 90 is substantially rectangular-shaped, and includes a front casing 91 and a rear casing 93. The front casing 91 engages with the rear casing 93 to define a first receiving space. Components of the electronic device, such as a display module (not shown) may be disposed in the first receiving space. The front casing 91 may have a viewing surface. The electronic device 90 further defines four locking slots 92 in an outer surface of the rear casing 93. The four locking slots 92 are located near the four corners of the rear casing 93, respectively.

Figure 2:
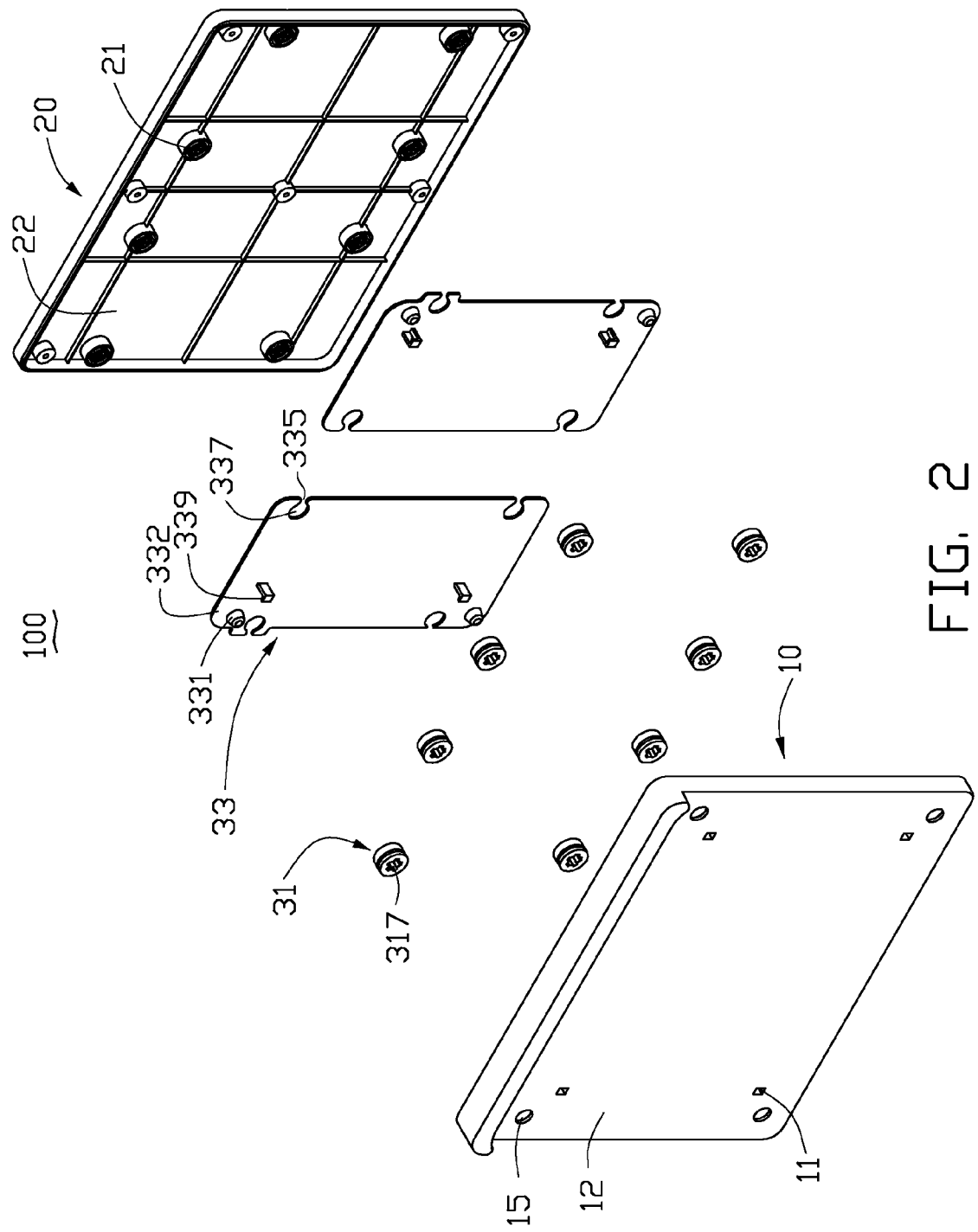
FIG. 2 is an exploded, isometric view of the positioning device of FIG. 1.
Figure 3:
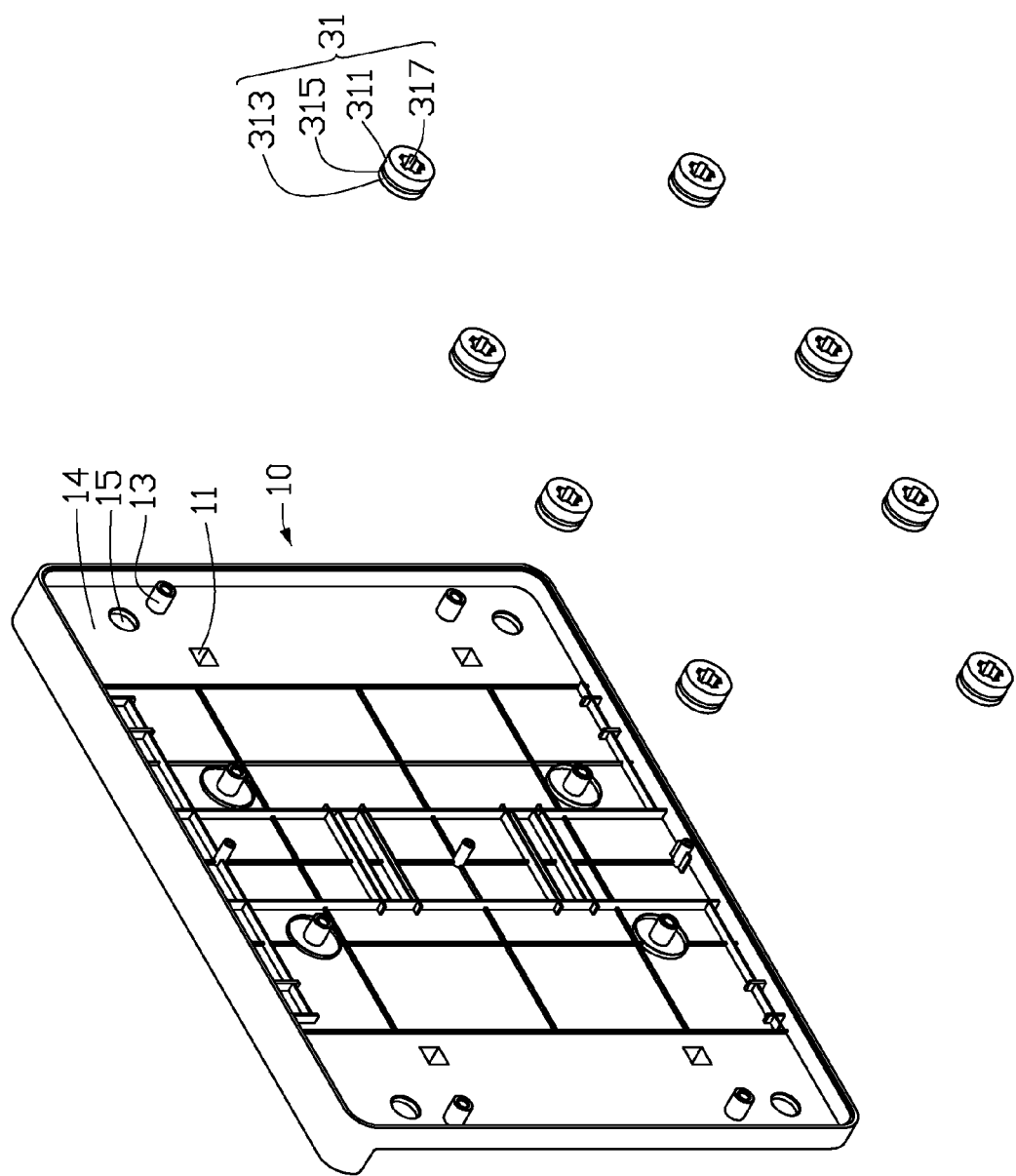
FIG. 3 is a reverse isometric view of a portion of the positioning device of FIG. 2.

Referring to FIGS. 2, 3, the positioning device 100 includes a front cover 10, a rear cover 20, a plurality of dampening members 31, and a supporting member 33. The rear cover 20 engages with the front cover 10 to define a second receiving space. The supporting member 33 and the plurality of dampening members 31 are disposed in the second receiving space.

The front cover 30 includes a front surface 12 facing the electronic device 90 and a rear surface 14 facing the rear cover 20. The front cover 30 defines four through holes 11 and four openings 15. Both of the through holes 11 and openings 15 pass through the front surface 12 and the rear surface 14. The four through holes 11 correspond with the four locking slots 92 of the electrical device 90. The four openings 15 are adjacent to the four through holes 11 correspondingly. A plurality of fixing posts 13 protrude from the rear surface 14 of the front cover 30.

The rear cover 20 includes opposite surfaces, i.e. an inner surface 22 and an outer surface. The inner surface 22 faces the front cover 10. A plurality of protrusions 21 disposed on the inner surface 22. The protrusions 21 are corresponding to the fixing posts 13, with a diameter of each protrusion 21 being larger than that of each fixing post 13.

The dampening members 31 are made of elastomeric material. In the exemplary embodiment, the dampening members 31 are made of rubber. Therefore, the dampening members 31 deform when pressed, and recover when the pressing force is released.

Figure 4:
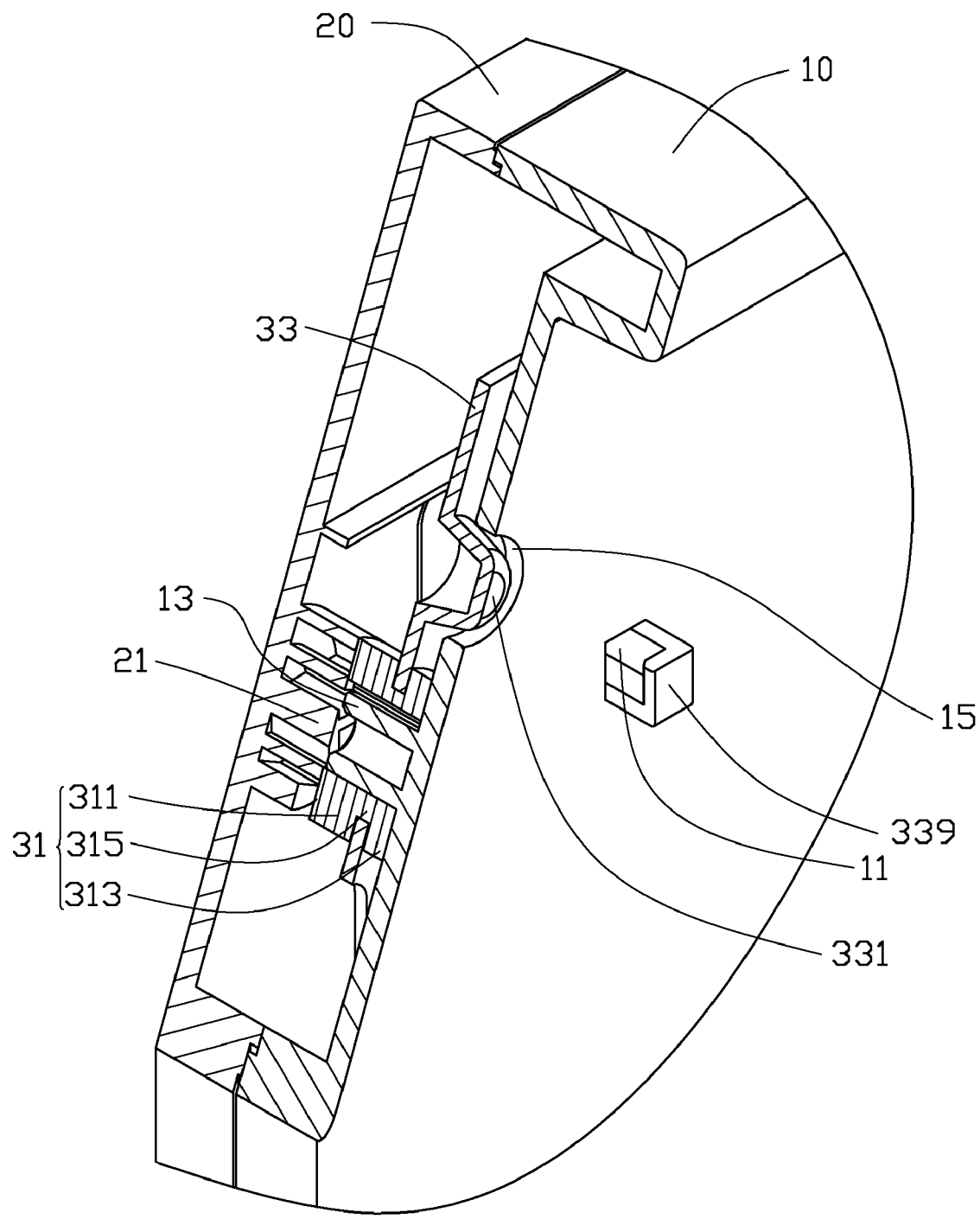
FIG. 4 is a partial, isometric view of the positioning device of FIG. 1, with a part cutaway.

Further referring to FIG. 4, each of the dampening members 31 is substantially cylindrical, and includes two end portions 311, 313 and a middle portion 315 connecting with the two end portions 311, 313. The two end portions 311, 313 and the middle portion 315 are cylindrical-shaped. A maximum diameter of each of the end portions 311, 313 is larger than that of the middle portion 315. A fixing hole 317 is defined in each dampening member 31 through the end portions 311, 313 and through the middle portion 315. The dampening members 21 may be fastened to the front cover 10 by sleeving on the fixing posts 13 correspondingly.

The supporting member 33 includes two supporting boards 332 which are aligned between the front cover 10 and the rear cover 20. The two supporting boards 332 may be flat boards. In the embodiment, the two supporting boards 332 are separated from each other, in other embodiment, the two supporting boards 332 may be integrally formed.

At two corners of each of the two supporting boards 332 includes two supporting portions 331. The four supporting portions 331 correspond with the four openings 15 and protruding from the front cover 10 after passing through the openings 15.

Each of the two supporting boards 332 defines several mounting through holes 337 and gaps 335. The mounting through holes 337 corresponds with the protrusions 21 of the rear cover 20 and the fixing posts 13 of the front cover 10. A diameter of each mounting through hole 337 is smaller than that of two end portions 311, 313, and slightly larger than that of the middle portions 315. Therefore, the supporting boards 332 may assemble with the dampening members 31, and with the mounting through holes 337 receiving the middle portions 315 of the dampening members 31 correspondingly. The gaps 335 communicate with the corresponding mounting through holes 337, to allow the middle portions 315 to slide into the mounting through holes 337.

Each of the two supporting boards 332 further includes two hooks 339. The four hooks 339 correspond to the through holes 11 of the front cover 10, so as to lock the electronic device 90 after passing through the through holes 11.

In assembly, firstly, the middle portions 315 of the dampening members 31 slide into the mounting through holes 337 from the gaps 335 correspondingly, therefore, the dampening members 31 are mounted on the supporting boards 332; then, the dampening members 31 are sleeved on the fixing posts 13 correspondingly. Thus, the supporting member 33 is elastically fixed on the front cover 10 without making direct contact with the front cover 10. The four hooks 339 are passed through the through holes 11 correspondingly, in order to lock in the locking slots 92 of the electronic device 90, and the supporting portions 331 passes through the openings 15 and protrudes from the front surface 12 of the front cover 10 correspondingly. Finally, the rear cover 20 is engaged with the front cover 10 without contacting with the supporting member 33, and the protrusions 21 resist with the fixing posts 13 correspondingly, therefore, the supporting member 33 is elastically fixed between the front cover 10 and the rear cover 20.

When the positioning device 100 is attached on the electrical device 90, the four hooks 339 are inserted into and locked in the locking slots 92 of the electronic device 90, after passed through the through holes 11, and the supporting portions 331 protrude in the front surface 12 of the front cover 10 after passed through the opening 15. Thus, the electronic device 90 is supported on the supporting portions 331 without contacting with the front surface 12 of the front cover 10. Therefore, the electronic device 90 is assembled on the positioning device 100, where the positioning device 100 may be attached to the back of a chair or other similar surface via adhesive or wiring to stable hold the electronic device 90.

During vibrations or shaking of the vehicle that the portable apparatus 200 is attached to, the vibrations or shaking will be transferred to the dampening member 31 from the front cover 10 and the rear cover 20, and is absorbed by the dampening member 31 via the dampening member 31 deforming. Therefore, the vibrations or shaking will not be directly transferred to the electronic device 90 which is locked by the hook 339 and supported on the supporting portion 331 of the supporting member 33.

It is to be understood, however, that even though numerous characteristics and advantages of the present disclosure have been set forth in the foregoing description, together with details of the structure and function of the present disclosure, the present disclosure is illustrative only, and changes may be made in detail, especially in matters of shape, size, and arrangement of parts within the principles of the present disclosure to the full extent indicated by the broad general meaning of the terms in which the appended claims are expressed.

What is claimed is:

1. A portable apparatus comprising:
    an electronic device defining a locking slot; and
    a positioning device detachably attached to the electronic device, the positioning device comprising:
        a cover defining an opening and a through hole;
        a supporting member comprising a hook protruding from the through hole to insert in the locking slot to lock in the electronic device and a supporting portion protruding from the opening of the cover to support the electronic device; and
        a dampening member fixed to the supporting member in the cover, the dampening member comprising two end portions and a middle portion disposed connecting the two end portions, the two end portions being resisted against the cover, and the middle portion being fixed on the supporting member.

2. The portable apparatus in claim 1, wherein the two end portions and the middle portion are cylindrical-shaped, a maximum diameter of each end portion is larger than that of the middle portion.

3. The portable apparatus in claim 1, wherein the dampening member defines a fixing hole, and a fixing post is disposed on the cover for inserting into the fixing hole.

4. The portable apparatus in claim 3, wherein the fixing hole is through the middle portion and the two end portions.

5. The portable apparatus in claim 1, wherein the supporting member defines a mounting hole to receive the middle portion.

6. The portable apparatus in claim 5, wherein a diameter of the mounting hole is smaller than that of each of the end portions.

7. The portable apparatus in claim 5, wherein the supporting member further defines a gap communicating with the mounting hole to allow the middle portion slide into the mounting hole.

8. The portable apparatus in claim 1, wherein the dampening member is made of elastomeric material.

9. The portable apparatus in claim 1, wherein the dampening member is made of rubber.

10. A positioning device for detachably positioned to an electronic device, the positioning device comprising:
    a cover defining an opening;
    dampening members fixed in the cover; and
    a supporting member mounted on the dampening members, the supporting member comprising supporting portions protrudable from the opening for resisting against the electronic device;
    wherein each of the dampening members comprises two end portions and a middle portion connect with the two end portions, the two end portions are fixed on the cover correspondingly, and the middle portions are fixed on the supporting member correspondingly.

11. The positioning device in claim 10, wherein a fixing hole is defined in each of the end portions, and a plurality of fixing posts are disposed on the cover for inserting into the fixing holes correspondingly.

12. The positioning device in claim 10, wherein the supporting member defines a plurality of mounting holes in the middle portions correspondingly.

13. The positioning device in claim 12, wherein the supporting member further defines a gap communicating with the mounting hole to allow the middle portion slide into the mounting hole.

14. The positioning device in claim 10, wherein each of the dampening members is made of rubber.

15. The positioning device in claim 10, wherein each of the dampening members is made of elastomeric material.

* * * * *